United States Patent
Hou et al.

(10) Patent No.: US 8,316,921 B2
(45) Date of Patent: Nov. 27, 2012

(54) PLATE TYPE HEAT PIPE AND HEAT SINK USING THE SAME

(75) Inventors: Chuen-Shu Hou, Taipei Hsien (TW); Jiang-Jun Hu, Shenzhen (CN); Min Lu, Shenzhen (CN); De-Yu Wang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 600 days.

(21) Appl. No.: 12/553,997

(22) Filed: Sep. 4, 2009

(65) Prior Publication Data
US 2011/0005725 A1    Jan. 13, 2011

(30) Foreign Application Priority Data
Jul. 13, 2009   (CN) .......................... 2009 1 0304293

(51) Int. Cl.
*F28D 15/04* (2006.01)

(52) U.S. Cl. .................. 165/80.2; 165/104.21

(58) Field of Classification Search ............... 165/80.2, 165/80.4, 80.5, 104.21, 104.26, 104.33, 170; 361/700
See application file for complete search history.

(56) References Cited

U.S. PATENT DOCUMENTS

| | | | | |
|---|---|---|---|---|
| 2,360,123 | A * | 10/1944 | Gerstung et al. | 165/298 |
| 6,397,935 | B1 * | 6/2002 | Yamamoto et al. | 165/104.26 |
| 2002/0070007 | A1 * | 6/2002 | Calaman et al. | 165/80.4 |
| 2003/0159806 | A1 | 8/2003 | Sehmbey et al. | |
| 2007/0240860 | A1 | 10/2007 | Meyer, IV et al. | |

* cited by examiner

*Primary Examiner* — Teresa Walberg
(74) *Attorney, Agent, or Firm* — Altis Law Group, Inc.

(57) ABSTRACT

A heat sink includes a fin assembly including a plurality of fins and a plate type heat pipe attached to the fin assembly. The plate type heat pipe includes a sealed shell in which a working fluid is filled, a wick layer formed on an inner face of the shell and a supporting member disposed in the shell. The supporting member includes a plurality of supporting portions and a plurality of bodies connecting the supporting portions. Each supporting portion includes a plurality of convex portions contacting a top of the wick layer and a plurality of concave portions contacting a bottom of the wick layer. The convex portions and the concave portions of each supporting portion are alternately arranged. Each convex portion and an adjacent concave portion cooperatively enclose a first through hole for the working fluid flowing therethrough.

20 Claims, 10 Drawing Sheets

PLATE TYPE HEAT PIPE AND HEAT SINK USING THE SAME

BACKGROUND

1. Technical Field

The disclosure relates to heat dissipation and, more particularly, to a plate type heat pipe having a firm structure, and a heat sink using the plate type heat pipe.

2. Description of Related Art

Nowadays, numerous heat sinks are used to dissipate heat generated by electronic devices. A heat sink with a plate type heat pipe is a common structure of the heat sinks. A vacuum chamber is defined in the heat pipe. A wick structure is formed on an inner face of the heat pipe, and a working fluid is contained in the chamber. As the plate type heat pipe is maintained in thermal contact with the electronic device, the working fluid contained in the chamber corresponding to a hotter section vaporizes into vapor. The vapor then spreads to fill the chamber, and when the vapor comes into contact with a cooler section of the chamber, it releases its latent heat and condenses. The condensate returns to the hotter section via a capillary force generated by the wick structure. Thereafter, the working fluid repeatedly vaporizes and condenses to form a circulation to thereby remove the heat generated by the electronic device.

However, the plate type heat pipe of the heat sink is prone to deformation when subjected to an inner or outer pressure during use, which may result in a disengagement of the wick structure from the inner face of the heat pipe, adversely affecting the performance of the heat pipe.

What is needed, therefore, is a plate type heat pipe and a heat sink using the plate type heat pipe which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
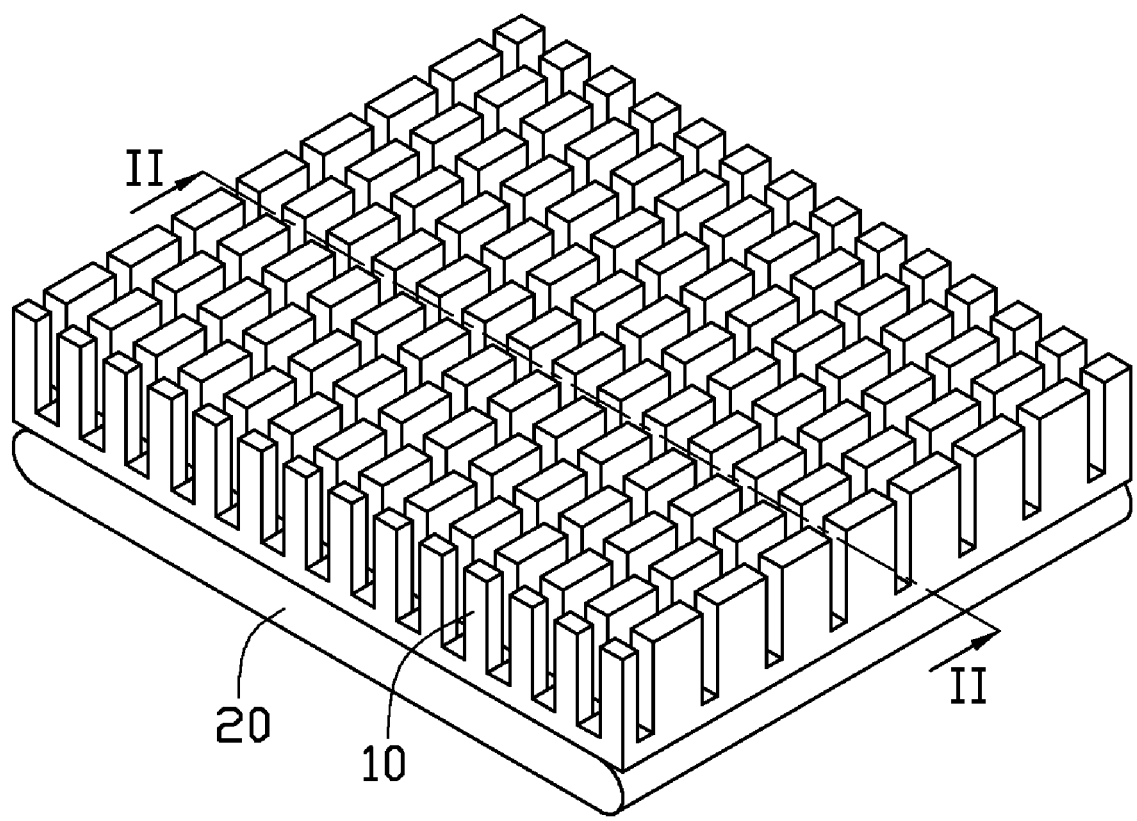
FIG. 1 is an isometric, assembled view of a heat sink in accordance with a first embodiment of the disclosure.
Figure 2:
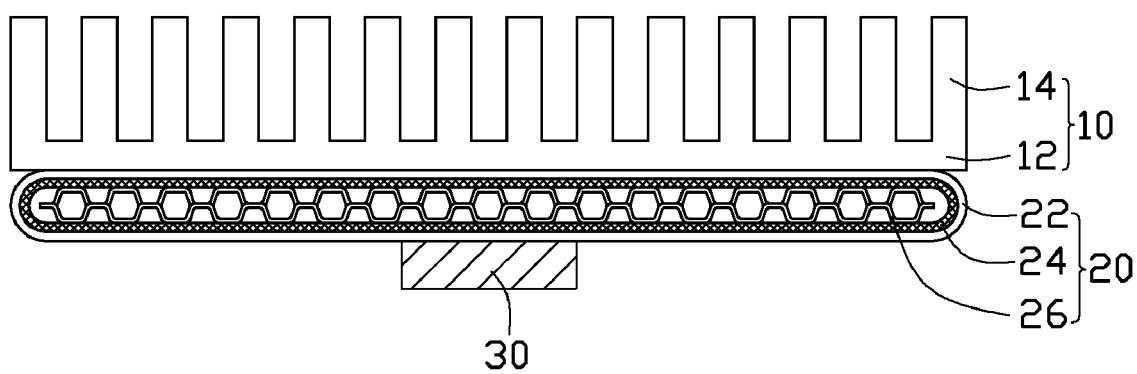
FIG. 2 is a sectional view of FIG. 1, taken along line II-II thereof.

Referring to FIGS. 1-2, a heat sink in accordance with a first embodiment of the disclosure comprises a fin assembly 10 and a plate type heat pipe 20 attached to the fin assembly 10. The fin assembly 10 includes a base 12 and a plurality of fins 14 extending from the base 12. A heat source 30 thermally contacts a bottom of the plate type heat pipe 20.

The plate type heat pipe 20 includes a sealed shell 22, a wick layer 24 formed on an inner face of the shell 22 and a supporting member 26 disposed in the shell 22. A working fluid (not labeled) is filled in the shell 22 and can flow from a top to a bottom of the shell 22 via a capillary force generated from the wick layer 24. The wick layer 24 is a sintered wick layer which is formed by sintering metal powder.

Figure 3:
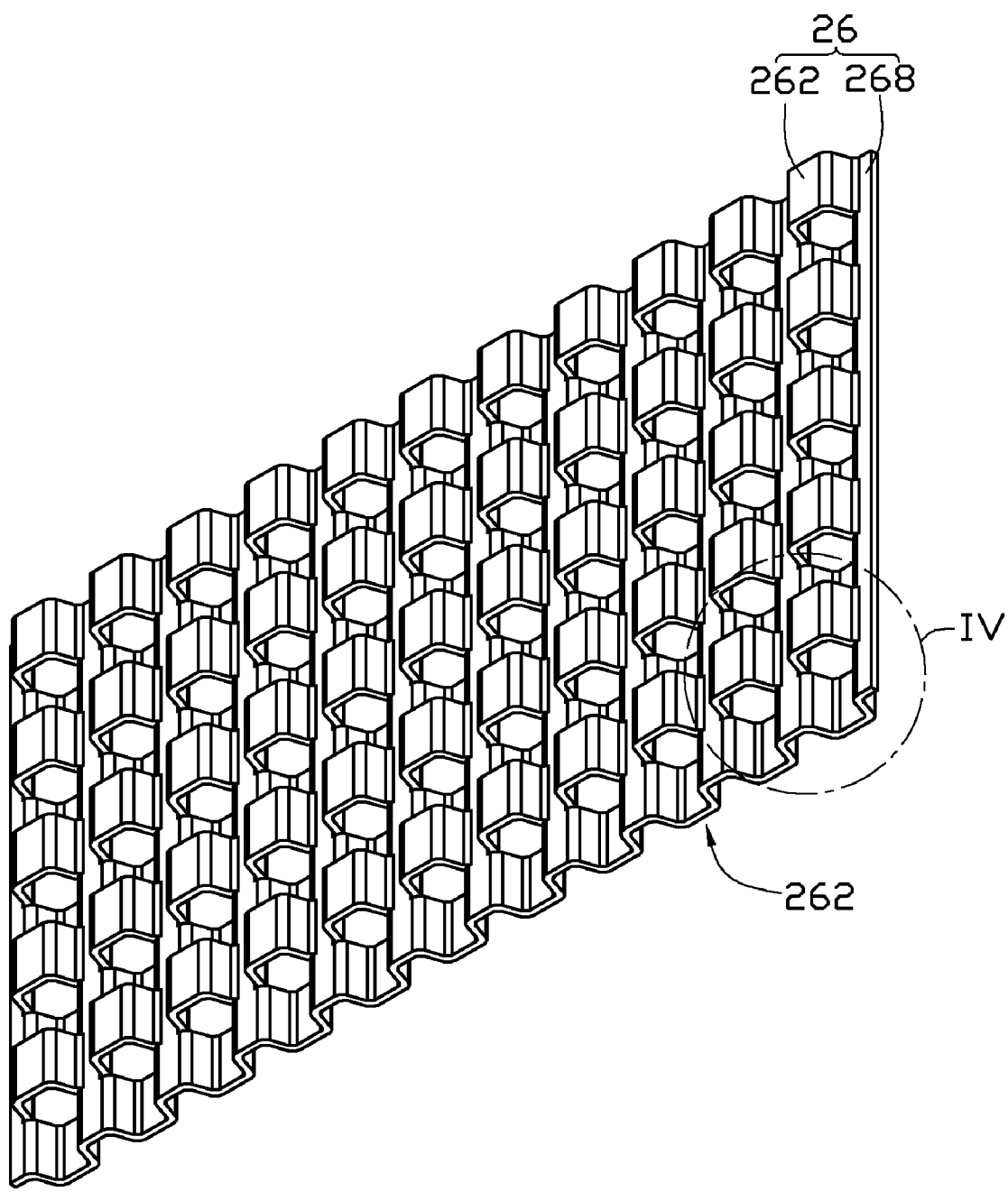
FIG. 3 is a perspective view of a supporting member of the heat sink of FIG. 2.
Figure 4:
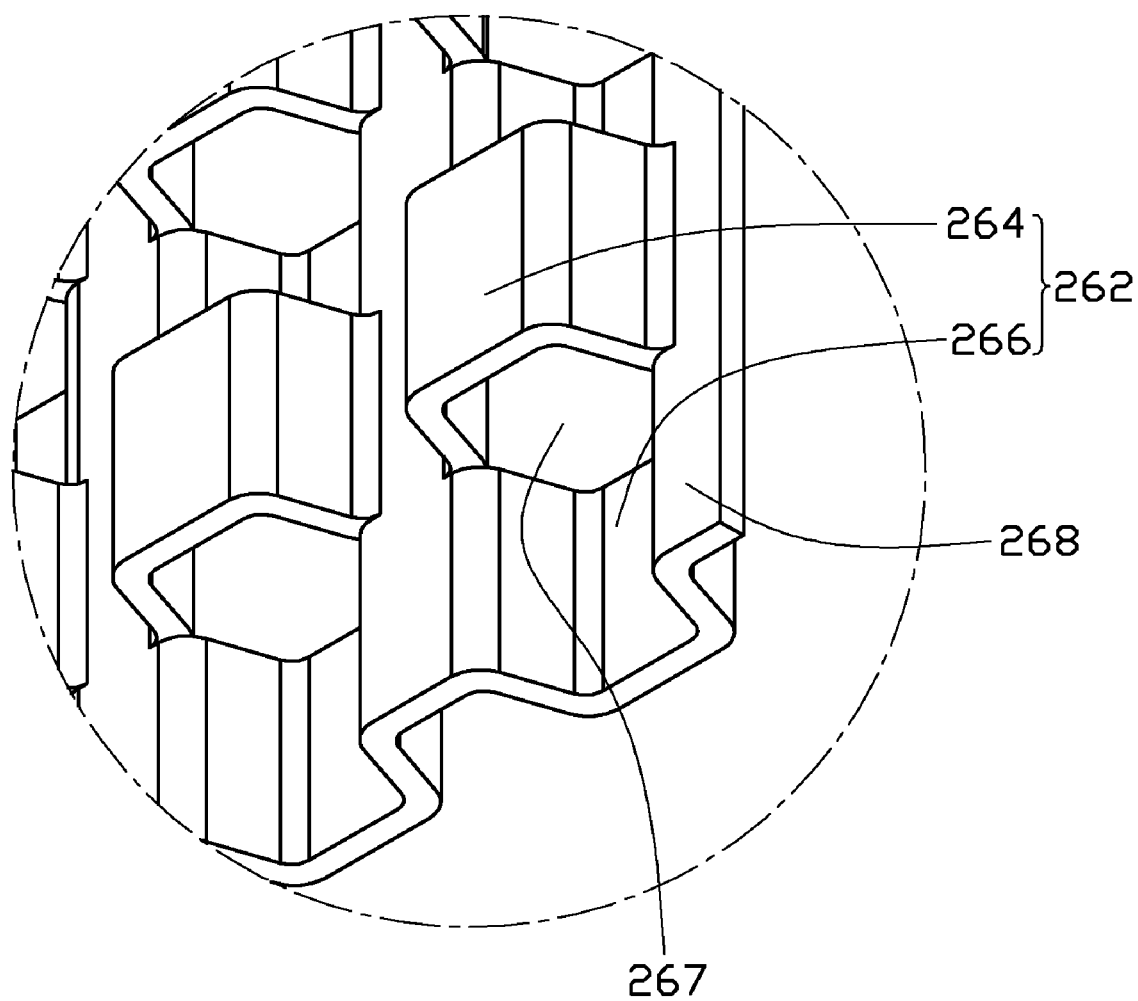
FIG. 4 is an enlarged view of a part IV shown in FIG. 3.
Figure 5:
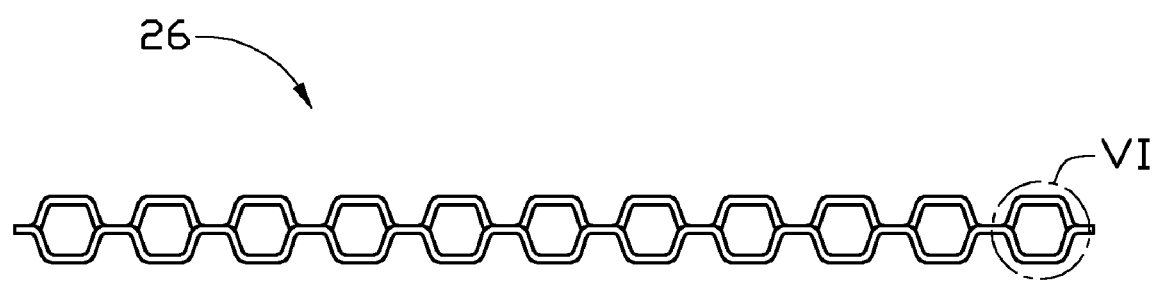
FIG. 5 is a view similar to FIG. 2, showing the supporting member in an enlarged scale.
Figure 6:
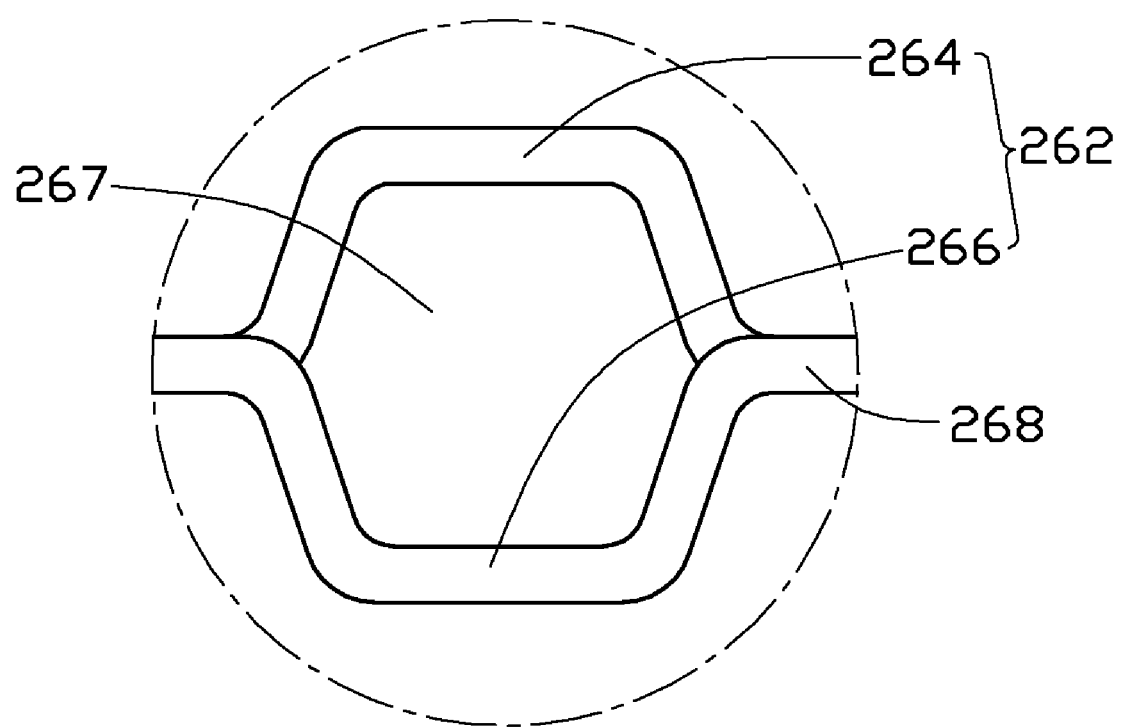
FIG. 6 is an enlarged view of a part VI shown in FIG. 5.
Figure 7:
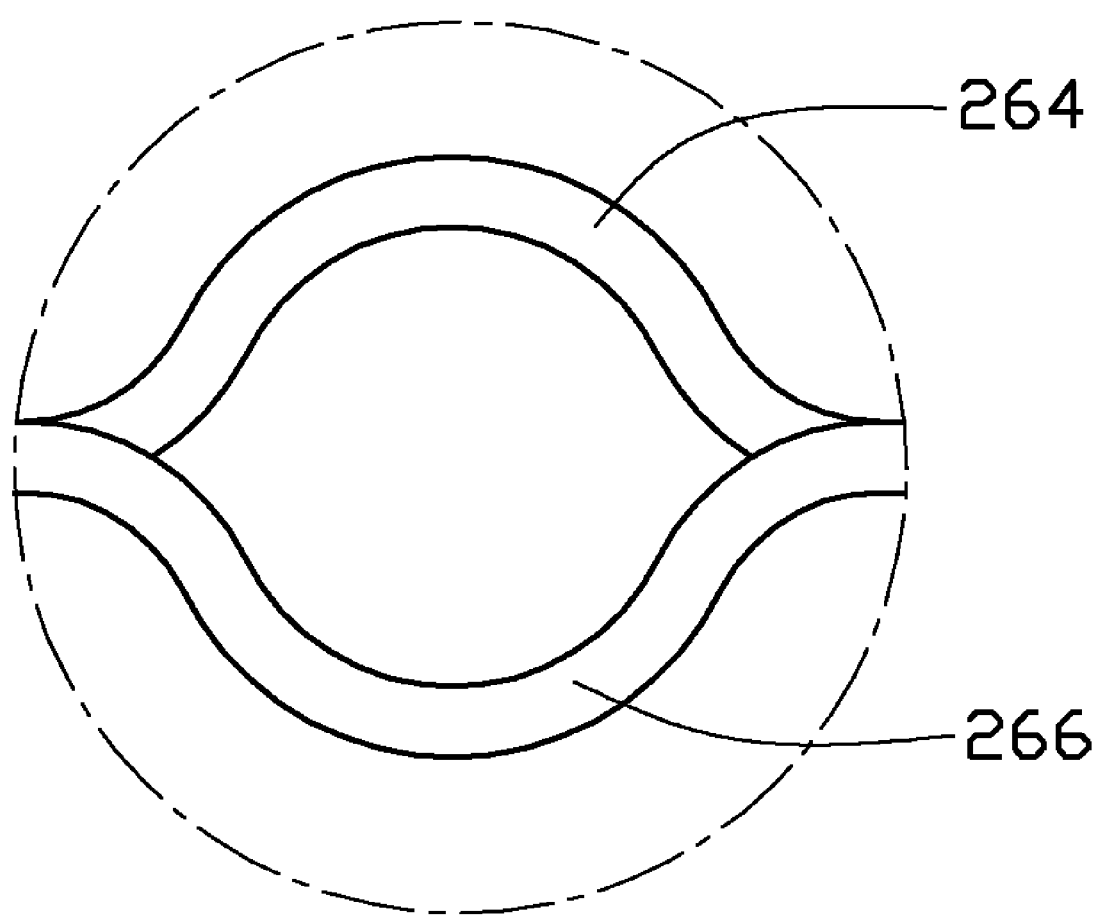
FIGS. 7-8 are views similar to FIG. 6, showing alternative supporting members which can replace the supporting member of FIG. 5.
Figure 8:
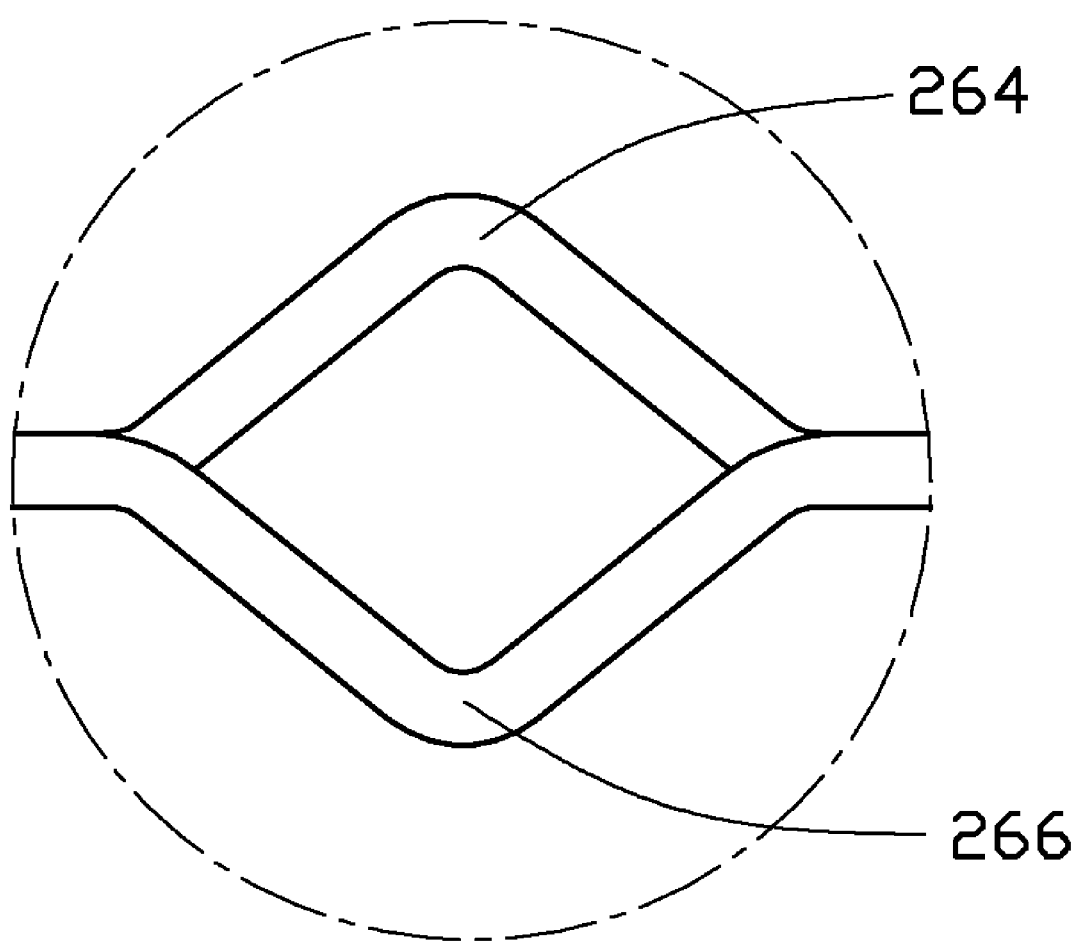

Also referring to FIGS. 3-4, the supporting member 26 is formed by successively punching two opposite sides of a metal sheet with a high strength. The supporting member 26 includes a plurality of supporting portions 262 and a plurality of rectangular bodies 268 connecting the supporting portions 262. Two adjacent supporting portions 262 are connected by a body 268 therebetween. The bodies 268 and the supporting portions 262 are alternate with each other along a transverse direction. Each supporting portion 262 includes a plurality of upwardly convex portions 264 contacting the wick layer 24 at the top of the shell 22 and a plurality of downwardly concave portions 266 contacting the wick layer 24 at the bottom of the shell 22. The convex portions 264 and the concave portions 266 of each supporting portion 262 are alternately arranged along a lengthwise direction. All of the bodies 268 are in the same plane. All of the convex portions 264 are located above the plane where the bodies 268 are located, and all of the concave portions 266 are located below the plane where the bodies 268 are located. Along a direction perpendicular to the supporting portion 262, the convex portions 264 or the concave portions 266 in the same row are connected by the bodies 268 and are located at the same side of the plane where the bodies 268 are located. In the same supporting portion 262, each convex portion 264 and an adjacent concave portion 266 cooperatively/together define a first through hole 267 therebetween for the vaporized working fluid flowing therethrough. All top ends of the convex portions 264 are in a first flat/horizontal face for contacting the wick layer 24 at the top of the shell 22, and all bottom ends of the concave portions 266 are in a second flat/horizontal face for contacting the wick layer 24 at the bottom of the shell 22. Each convex portion 264 or concave portion 266 has a trapezoid profile as shown in FIGS. 5-6. It is appreciated that the profile of each convex portion 264 or concave portion 266 in other embodiment can be other shape such as semicircular or triangular as shown in FIGS. 7-8.

In use, the plate type heat pipe 20 of the heat sink thermally contacts the heat source 30 to absorb heat therefrom. The working fluid at the bottom of the shell 22 is heated and vaporized to flow upwardly through the first through holes 267 of the supporting member 26 to reach the top of the shell 22. The vaporized working fluid exchanges heat with the top of the shell 22 and the fin assembly 10 and then is condensed to liquid. The condensed working fluid returns to the bottom of the shell 22 via the wick layer 24.

Figure 9:
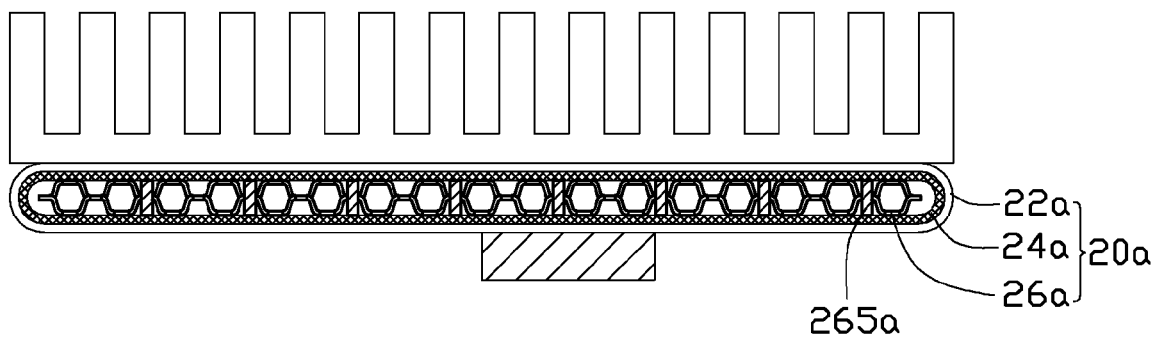
FIG. 9 is a sectional view of a heat sink in accordance with a second embodiment of the disclosure.
Figure 10:
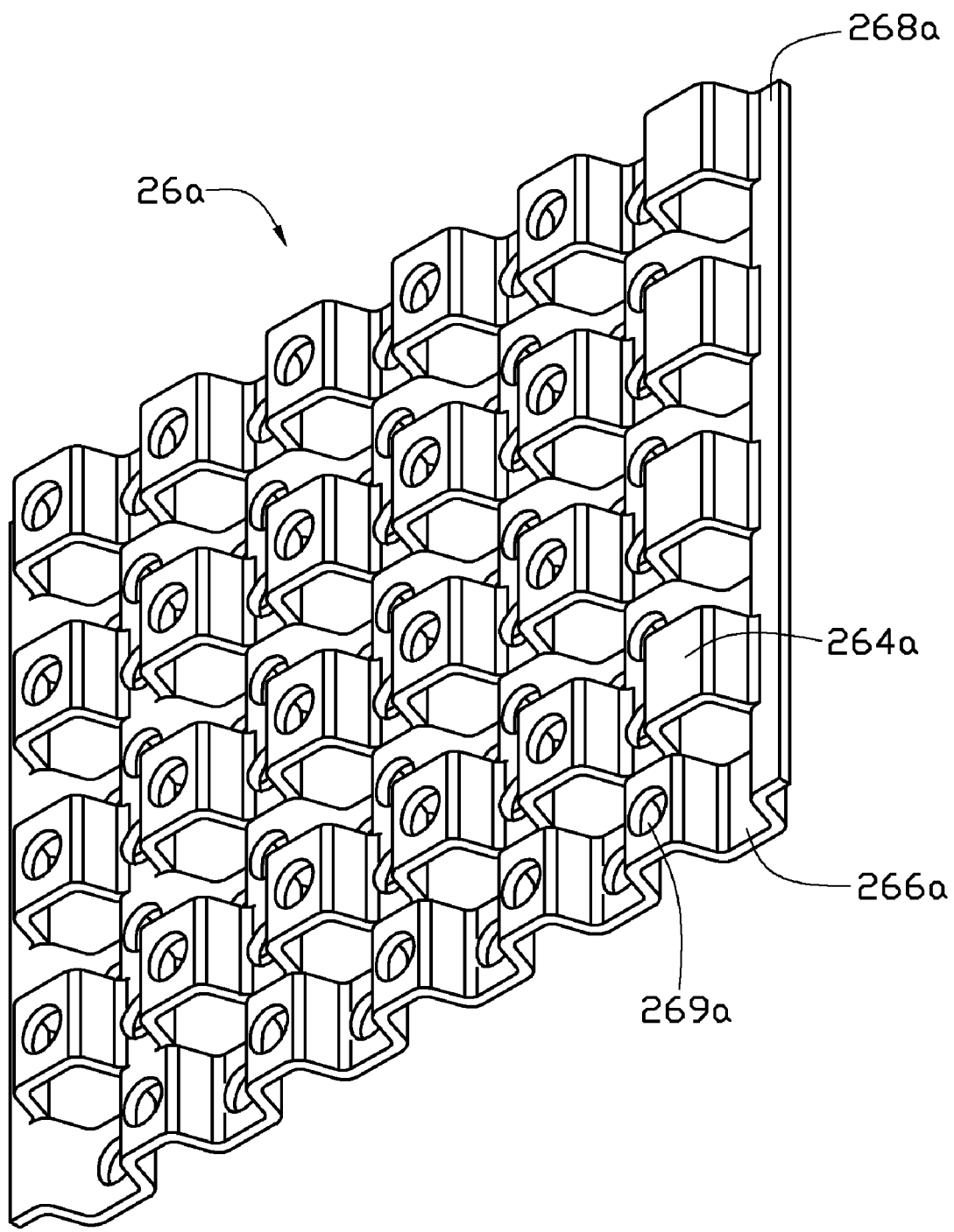
FIG. 10 is a perspective view of a supporting member of the heat sink of FIG. 9.

FIG. 9 shows a heat sink in accordance with a second embodiment of the disclosure. The heat sink of the second embodiment is similar to that of the first embodiment. The differences are that a supporting member 26 of a plate type heat pipe 20a of the heat sink further defines a plurality of second through holes 269a which are distributed in convex portions 264a, concave portions 266a and bodies 268a, respectively (shown in FIG. 10), and a plurality of copper shafts 265a are provided to extend through the second through holes 269a defined in the bodies 268a of the supporting member 26a. The copper shafts 265a each have two ends thereof welded at top and bottom faces of shell 22a for supporting the shell 22a and preventing the heat pipe 20a from deforming when subjected to a large internal vapor pressure or an external vibration. Other second through holes 269a without the copper shafts 265a extending therethrough are provided for vaporized working fluid flowing upwardly therethrough.

According to the disclosure, the supporting member 26, 26a in the plate type heat pipe 20, 20a can support the shell 22, 22a to prevent the shell 22, 22a from deforming, and prevent the wick layer 22, 22a from disengaging from the shell 22, 22a; thus, the heat sink in accordance with the present disclosure can have a normal function even when it is subjected to a large internal vapor pressure or an external vibration.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A plate type heat pipe comprising:
    a sealed shell in which a working fluid is filled;
    a wick layer formed on an inner face of the shell; and
    a supporting member disposed in the shell and comprising a plurality of supporting portions and a plurality of bodies connecting the supporting portions;
    wherein each supporting portion comprises a plurality of convex portions contacting a top of the wick layer and a plurality of concave portions contacting a bottom of the wick layer, the convex portions and the concave portions of each supporting portion being alternately arranged, and each convex portion and an adjacent concave portion cooperatively defining a first through hole therebetween for the working fluid flowing therethrough;
    wherein the supporting portions and the bodies of the supporting member define a plurality of second through holes therein.

2. The plate type heat pipe of claim 1, wherein a profile of each of the convex portions and the concave portions has one of following shapes: a trapezoid shape, a semicircular shape and a triangular shape.

3. The plate type heat pipe of claim 1, wherein all of the bodies are in the same plane.

4. The plate type heat pipe of claim 3, wherein all of the convex portions are located above the plane where the bodies are located, and all of the concave portions are located below the plane where the bodies are located.

5. The plate type heat pipe of claim 4, wherein along a direction perpendicular to the supporting portion, the convex portions or the concave portions in the same row are connected by the bodies and are located at the same side of the plane where the bodies are located.

6. The plate type heat pipe of claim 1, wherein the supporting member is formed by successively punching two opposite sides of a metal sheet.

7. The plate type heat pipe of claim 1, wherein the supporting portions and the bodies are arranged alternately.

8. The plate type heat pipe of claim 1, wherein all of top ends of the convex portions are in a first flat face for contacting the top of the wick layer, and all of bottom ends of the concave portions are in a second flat face for contacting the bottom of the wick layer.

9. The plate type heat pipe of claim 1, wherein the wick layer is a sintered wick layer.

10. The plate type heat pipe of claim 1, further comprising a plurality of shafts extending through the second through holes defined in the bodies of the supporting member, with two ends thereof welded at a top and a bottom of the shell.

11. A heat sink comprising:
    a fin assembly comprising a plurality of fins; and
    a plate type heat pipe attached to the fin assembly, comprising:
    a sealed shell in which a working fluid is filled;
    a wick layer formed on an inner face of the shell; and
    a supporting member disposed in the shell and comprising a plurality of supporting portions and a plurality of bodies connecting the supporting portions;
    wherein each supporting portion comprises a plurality of convex portions contacting a top of the wick layer and a plurality of concave portions contacting a bottom of the wick layer, the convex portions and the concave portions of each supporting portion being alternately arranged, and each convex portion and an adjacent concave portion cooperatively defining a first through hole for the working fluid flowing therethrough;
    wherein the supporting portions and the bodies of the supporting member define a plurality of second through holes therein.

12. The heat sink of claim 11, further comprising a plurality of shafts extending through the second through holes defined in the bodies of the supporting member, with two ends thereof welded at top and bottom of the inner faces of the shell.

13. The heat sink of claim 11, wherein all of the bodies are in the same plane.

14. The heat sink of claim 13, wherein all of the convex portions are located above the plane where the bodies are located, and all of the concave portions are located below the plane where the bodies are located.

15. The heat sink of claim 14, wherein along a direction perpendicular to the supporting portion, the convex portions or the concave portions in the same row are connected by the bodies and are located at the same side of the plane where the bodies are located.

16. The heat sink of claim 11, wherein a profile of each of the convex portions and the concave portions has one of following shapes: a trapezoid shape, a semicircular shape and a triangular shape.

17. The heat sink of claim 11, wherein the supporting member is formed by successively punching two opposite sides of a metal sheet.

18. The heat sink of claim 11, wherein the supporting portions and the bodies are arranged alternately.

19. The heat sink of claim 11, wherein all of top ends of the convex portions are in a first flat face for contacting the top of the wick layer, and all of bottom ends of the concave portions are in a second flat face for contacting the bottom of the wick layer.

20. The heat sink of claim 11, wherein the wick layer is a sintered wick layer.

* * * * *